United States Patent
Ryoo et al.

(10) Patent No.: US 6,737,917 B2
(45) Date of Patent: May 18, 2004

(54) DIGITAL POWER AMPLIFIER

(75) Inventors: Tae Ha Ryoo, Taejeon (KR); Chan Kim, Kyungsangnam-Do (KR); Nam In Kim, Taejeon (KR)

(73) Assignee: DLOGIX Co., Ltd., Seoul (KR)

( * ) Notice: Subject to any disclaimer, the term of this patent is extended or adjusted under 35 U.S.C. 154(b) by 0 days.

(21) Appl. No.: 10/221,891

(22) PCT Filed: Jan. 18, 2001

(86) PCT No.: PCT/KR01/00085
§ 371 (c)(1),
(2), (4) Date: Sep. 17, 2002

(87) PCT Pub. No.: WO02/058229
PCT Pub. Date: Jul. 25, 2002

(65) Prior Publication Data
US 2003/0090318 A1 May 15, 2003

(51) Int. Cl.[7] .................................... H03F 3/38
(52) U.S. Cl. ...................................... 330/10; 330/207 A
(58) Field of Search ............................ 330/10, 207 A, 330/251

(56) References Cited
U.S. PATENT DOCUMENTS

| 4,504,793 A | | 3/1985 | Yokoyama | |
|---|---|---|---|---|
| 4,968,948 A | * | 11/1990 | Tokumo et al. | 330/10 |
| 5,115,203 A | | 5/1992 | Krett et al. | |
| 5,767,740 A | * | 6/1998 | Fogg | 330/10 |
| 5,805,020 A | * | 9/1998 | Danz et al. | 330/10 |

FOREIGN PATENT DOCUMENTS

| JP | 57-170606 | 10/1982 |
|---|---|---|
| JP | 60-089110 | 5/1985 |
| JP | 07-075189 | 3/1995 |
| JP | 07-221564 | 8/1995 |
| JP | 07-231226 | 8/1995 |
| JP | 10-126170 | 5/1998 |
| JP | 10-150329 | 6/1998 |

* cited by examiner

Primary Examiner—Henry Choe
(74) Attorney, Agent, or Firm—Gardner Carton & Douglas LLP

(57) ABSTRACT

The present invention relates to amplifier combined digital amplifier using pulse width modulation and analog amplifier, and more particularly, to amplifier converting the analog input signal to pulse width modulation signal by comparing the analog input signal with triangle-wave, inputting the pulse width modulation signal to a dead time logic circuit, controlling the "ON", and "OFF" operation of output transistor by output signal of the dead time logic circuit and converting the pulse width modulation signal of the output transistor to amplified analog signal using LC low pass filter. The present invention reduces the loss of efficiency of output transistor. Therefore the size of heat radiating plate can be easily reduced and amplifier with compact size can be accomplished by the present invention.

6 Claims, 6 Drawing Sheets

FIG.1 [PRIOR ART]

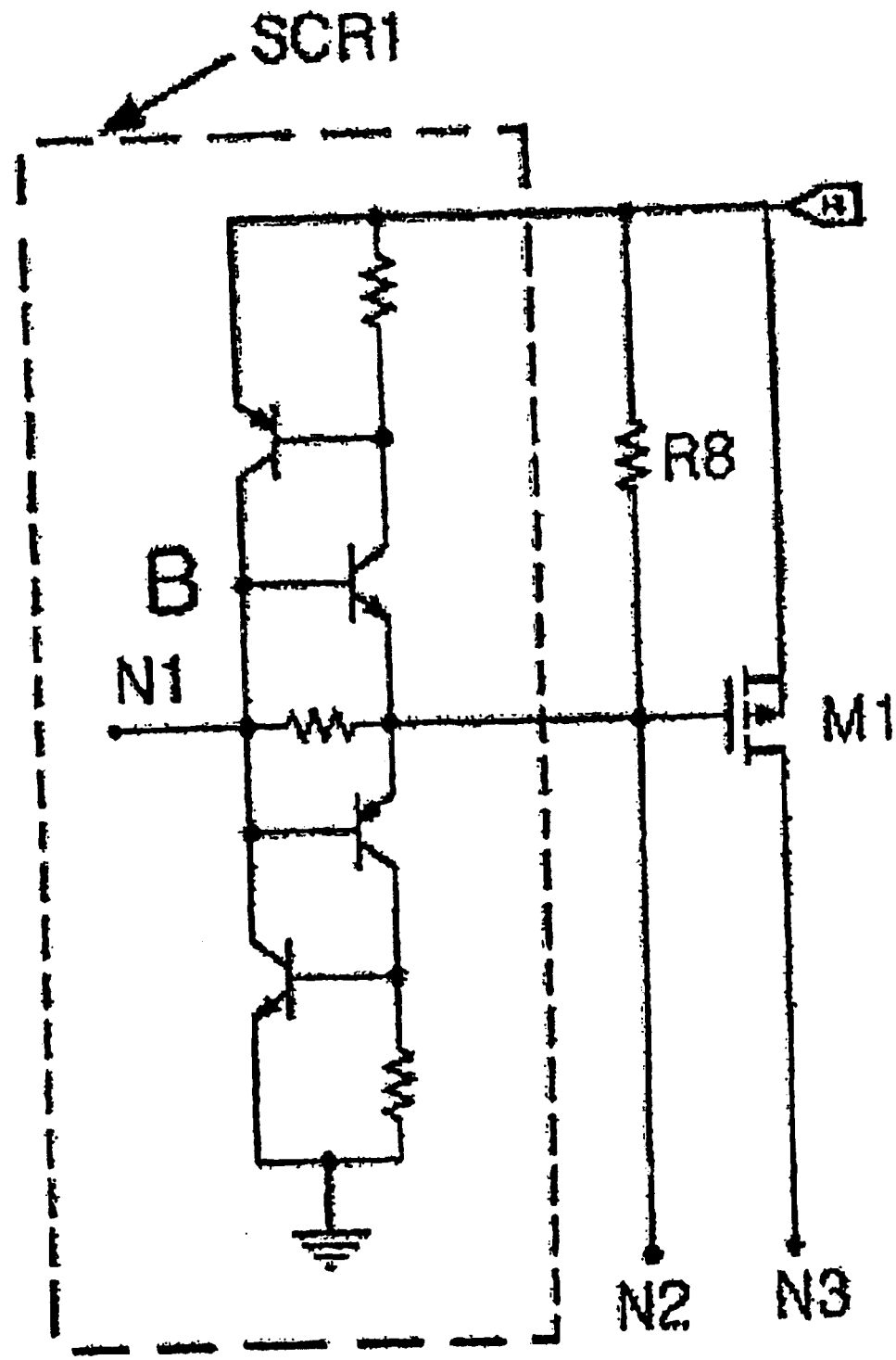
FIG. 3 [PRIOR ART]

DIGITAL POWER AMPLIFIER

TECHNICAL FIELD

The present invention generally relates to an amplifier reciprocally connecting a digital amplifier having a pulse width modulation switching system with an analog amplifier, more specifically, to a digital power amplifier converting an inputted analog signal into a digital signal having a regular width by comparing the analog signal with a triangular wave, delaying the digital signal by the use of a logic gate to turn on/off output transistors using the delayed signal, and making the signal operated by the output transistors pass an LC low band pass filter to reproduce the analog signal.

BACKGROUND ART

It has been emphasized that linearity of sound amplifiers is more important than efficiency. Therefore, linear amplifiers (analog amplifiers) are the main current of the market by the trend of the times and deficiency in technologies, without considering power consumption much. Until now, analog amplifiers having excellent linearity, ranked A, B, and AB, have been adopted for sound amplifiers. However, when implementing these types of amplifiers as large output amplifiers, it may increase the size of the amplifiers because heatproof plates and cooling fans are essential due to a temperature increase when other energies except the outputted energy are converted into heat, causing great amount of power loss.

On the other hand, in the case of a Push-Pull B amplifier adopted to improve the above problems, it combines two transistors as emitter-floor type to reduce energy loss, thereby obtaining relatively high efficiency, however crossover distortion may occur in levels having smaller signals. The B amplifier can improve crossover distortion caused by small signals to some extent by applying an appropriate sub-feedback, however it cannot completely solve the deterioration of harmonic distortion rates when flowing a high-voltage large current. Because two transistors of the B amplifier are turned on/off in turns, thus it is easy to turn on/off when a small amount of current flows, but it is difficult to quickly turn on/off when a large amount of current flows. That is, it is difficult to quickly turn on/off in a large current area because a bias current does not flow in the B amplifier at all in normal times, thereby deteriorating harmonic distortion rates.

Portions of current flow in the AB amplifier, which is an intermediate type of the A and the B amplifiers, even there is no signal. The size of the current is much smaller than that of the A amplifier, and far bigger than that of the B amplifier. Therefore, the more bias current flows, the more characteristics become close to the A amplifier, on the contrary, the less the bias current flows, the more characteristics become close to the B amplifier.

An analog amplifier has various structures according to configuration, and here, the B amplifier is described in FIG. 1.

The B amplifier described in FIG. 1 has approximately 75% efficiency, emitting approximately 25% loss as heat. And, analog signals are inputted to output transistors (QA, QB), causing the output transistors to keep operating, thus lowering efficiency of the output transistors, and requiring a heatproof plate and a cooling fan. As a result, the size of the amplifier gets bigger owing to the heatproof plate and the cooling fan, causing a noise. The life span of the amplifier can be shortened due to a temperature increase. However, the biggest problem is that efficiency of the amplifier gets deteriorated.

DISCLOSURE OF INVENTION

To solve the above problems, it is an object of the present invention to provide a digital power amplifier applying digital signals to output transistors to output the digital signals, in order to prevent efficiency deterioration of the output transistors as well as preventing the size of the transistors from increasing due to a constant signal applied to the output transistors, thereby improving efficiency of the output transistors.

To achieve the above object, the present invention provides a digital amplifier comprising an amplifier amplifying inputted analog signals; a triangular wave oscillator generating a triangular wave having a regular frequency; a comparator comparing output signals of the amplifier with output signals of the triangular wave oscillator to output a square wave; a switching block composed of a first switch and a second switch and switching the first switch and the second switch in turns by output signals of the comparator; a controller preventing the first switch and the second switch of the switching block from being in the same state at the same time; a filter performing a filtering according to output signals of the switching block controlled by the controller; and a sub-feedback circuit performing a sub-feedback operation for output signals of the filter to input the sub-fed signals to the amplifier.

Also, the digital power amplifier comprises a first amplifier block including a non-inverting amplifier performing a non-inverting amplification for inputted analog signals; a triangular wave oscillator generating a triangular wave having a regular frequency; a first comparator comparing output signals of the amplifier with output signals of the triangular wave oscillator to output a square wave; a first switching block composed of a first switch and a second switch and switching the first switch and the second switch in turns by output signals of the first comparator; a first controller preventing the first switch and the second switch of the switching block from being in the same state at the same time; a first filter performing a filtering according to output signals of the first switching block controlled by the controller; and a first sub-feedback circuit performing a sub-feedback operation for output signals of the first filter and inputting the sub-fed signals to the amplifier.

The digital power amplifier comprises a second amplifier block including an inverting amplifier inputting inverted analog signals and inputting a regular voltage to amplify the analog signals; a second comparator comparing output signals of the inverting amplifier with output signals of the triangular wave oscillator to output a square wave; a second switching block composed of a third switch and a fourth switch and switching the third switch and the fourth switch in turns by output signals of the second comparator; a second controller preventing the first switch and the second switch of the switching block from being in the same state at the same time; a second filter performing a filtering according to output signals of the second switching block controlled by the second controller; and a second sub-feedback circuit performing a sub-feedback operation for output signals of the second filter and inputting the sub-fed signals to the inverting amplifier. The first amplifier block and the second amplifier block are symmetrical to each other based on load.

BRIEF DESCRIPTION OF THE DRAWINGS

The above and other objects and advantages of the present invention will become readily apparent from the description that follows, with reference to the accompanying drawings, in which:

FIG. 3 is a circuit diagram showing an equivalent circuit and peripheral circuits of a general SCR circuit installed between a power MOS transistor and a controller.

DETAILED DESCRIPTION OF THE INVENTION

Figure 1:
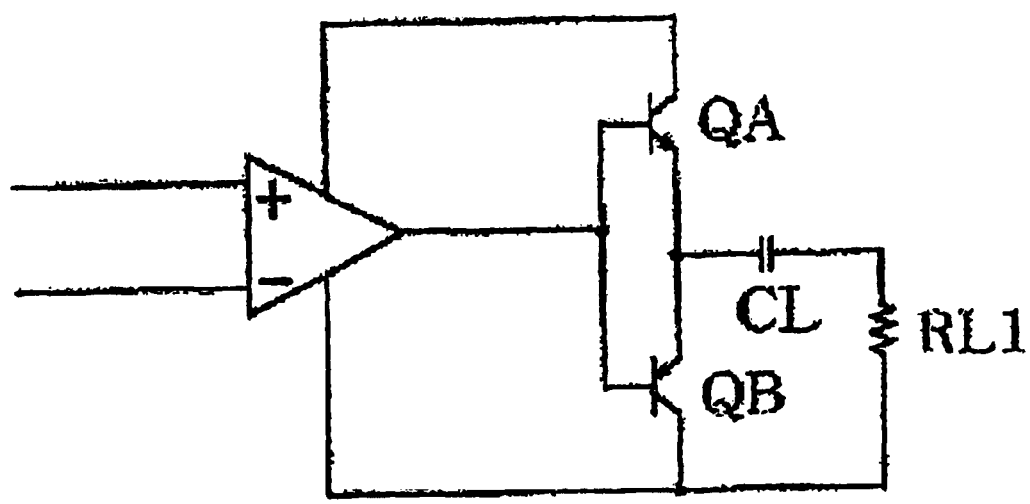
FIG. 1 is a simple circuit diagram of an existing B analog amplifier.
Figure 2:
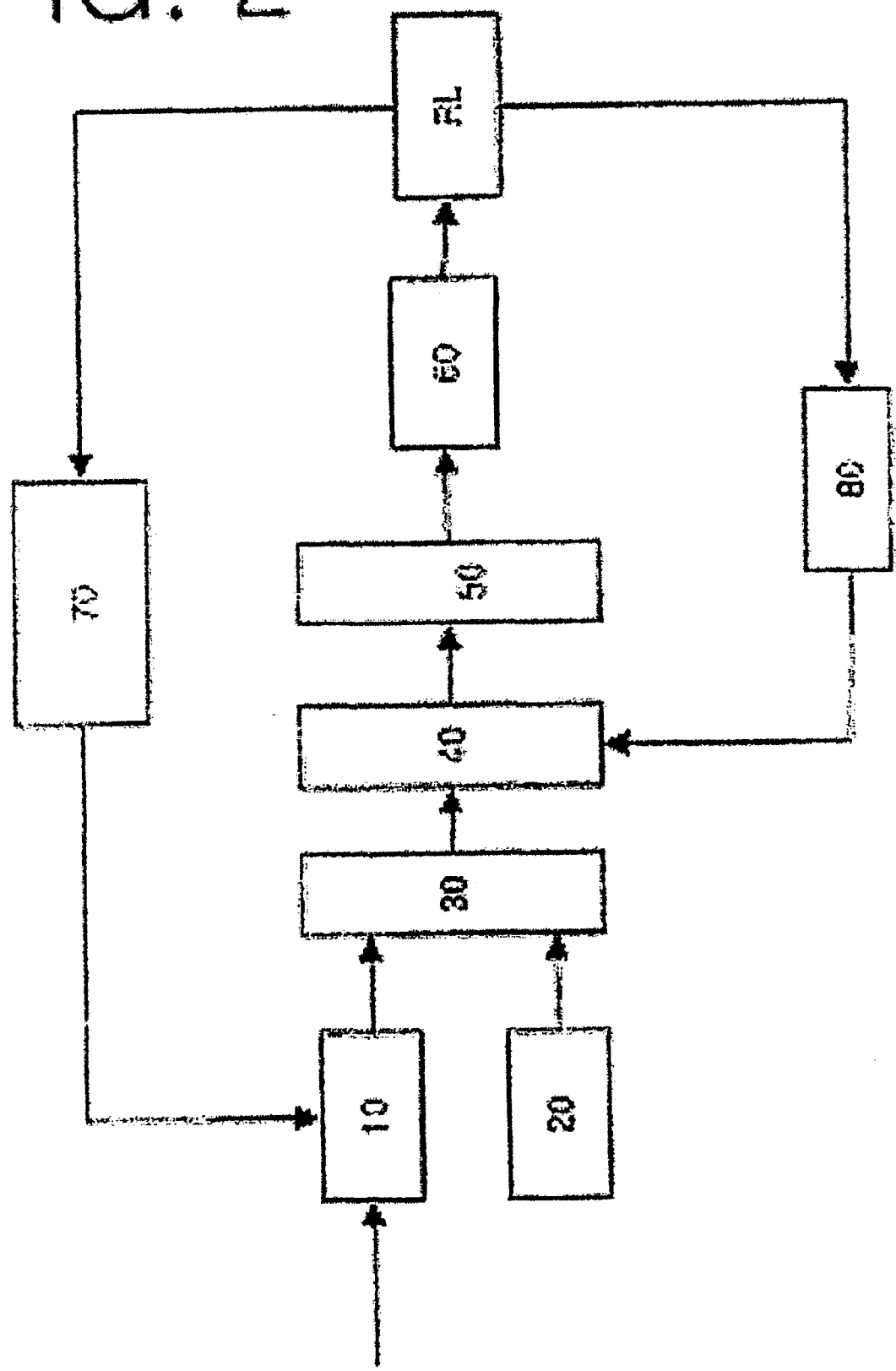
FIG. 2 is a block diagram showing configuration of a digital power amplifier in accordance with the present invention.

FIG. 2 is a block diagram showing configuration of a digital power amplifier in accordance with the present invention. Referring to FIG. 2, the digital power amplifier comprises an amplifier block as follows. An amplifier (10) amplifies an analog signal. An oscillator (20) oscillates a signal having a regular frequency. A comparator (30) inputs the amplified analog signal and the signal having the regular frequency, and compares the two signals to output a square wave having a specific frequency, then converts the square wave into a digital signal. A switching block (50) performs a switching operation by using the square wave. A controller (40) controls the switching block. A filter (60) converts a digital signal passing through the switching block (50) into an analog signal. A sub-feedback circuit (70) performs a sub-feedback operation for the output signal passing through the filter (60), to reduce errors. In addition, a protection circuit (80) for protecting a circuit is further comprised.

The amplifier (10) amplifies the analog signal same as a voice signal and the sub-fed output signal at regular size, and inputs the amplified signals to the comparator (20).

The oscillator (20) generates a triangular wave having approximately 500~1000 kHz frequencies, and inputs the triangular wave to the comparator (20). The comparator (30) compares the inputted analog signal with the triangular wave. If the analog signal is bigger than a signal of the triangular wave, the comparator generates a high signal. On the contrary, if the signal of the triangular wave is bigger than the analog signal, the comparator generates a low signal to make a square wave. The widths of the square wave are differentiated by the change of slopes in accordance with analog signal time.

The switching block (50) performs a switching operation by a signal outputted from the comparator, to make each output transistor composed of a P-channel Power MOS transistor and an N-channel Power MOS transistor turned on in turns. However, even though the transistors perform switching operations in turns within a short time, the transistors maintain one state in the process of changing to an off state from an on state or to the on state from the off state. Therefore, the switching block (50) performs the switching operation in turns within a short time, thereby causing the transistors to be in the same state at the same time. To prevent this situation, the controller (40) is comprised. The controller (40) delays switching time of the transistors to prevent the transistors of the switching block (50) from being in the same state at the same time.

The controller (40) is composed of digital logic gates such as an OR gate and an AND gate. Also, an inverter can be connected to the OR gate. Each gate inputs a digital signal such as the square wave outputted from the comparator (30), and the OR gate of each logic gate inputs an output signal of the AND gate. The AND gate inputs an output signal of the OR gate. Also, if a short current flows into load to protect a circuit, the protection circuit (80) is connected to the load to make a transistor of the controller (40) turned off, and a signal of the protection circuit is inputted to the OR gate and the AND gate. Each of the above gates performs a correct operation by the input signal of the comparator (30) and other gate signals, therefore delay time is required as much as the time when an inputted signal of a gate is inputted to other gate. As a result, it prevents the Power MOS transistors of the switching block (50) from being overlapped in the same state while performing switching operations. Generally, the protection circuit (80) inputting a signal to a gate outputs a high signal. If a short current flows in load, the protection circuit outputs a low signal. Therefore, the OR gate and the AND gate can control the input signals of the comparator and signals passing through a gate, regardless of input signals of the protection circuit (80). If the short current flows in the load and low signals are inputted to the OR gate and the AND gate, the protection circuit (80) turns off each output transistor to intercept the signal inputting.

In addition, an SCR circuit is connected between gate terminals of the output transistors and an output terminal of a control circuit, to perform a smooth switching operation of the Power MOS transistors.

FIG. 3 shows an equivalent circuit and peripheral circuits of a general SCR circuit installed between Power MOS transistors and a controller. Two thyristors are connected in serial. If a high signal is inputted to a gate terminal (B) of a thyristor, electricity flows into the thyristor, thus turning on a Power MOS transistor (M1). Then, an N3 is converted into a high state. If a low signal is inputted to the gate terminal (B), a reverse voltage is applied to the thyristor, and the Power MOS transistor (M1) is turned off. FIG. 3 shows configuration of the general SCR circuit, and a bias voltage can be controlled in a different method from the FIG. 3. With the bias voltage controlled by the SCR, switching operations of Power MOS transistors (M1, M3, M1', M3') of the switching block are controlled.

The filter (60) is a low band pass filter. When a Power MOS transistor is converted to an on state from an off state to apply a voltage to a coil of the low band pass filter, a square wave is applied to the low band pass filter. The square wave can be outputted in the same signal as an analog signal inputted according to characteristics of the low band pass filter. An analog signal outputted from the load is inputted to the amplifier (10) via the sub-feedback circuit (70), to compensate output signals.

Figure 4A:
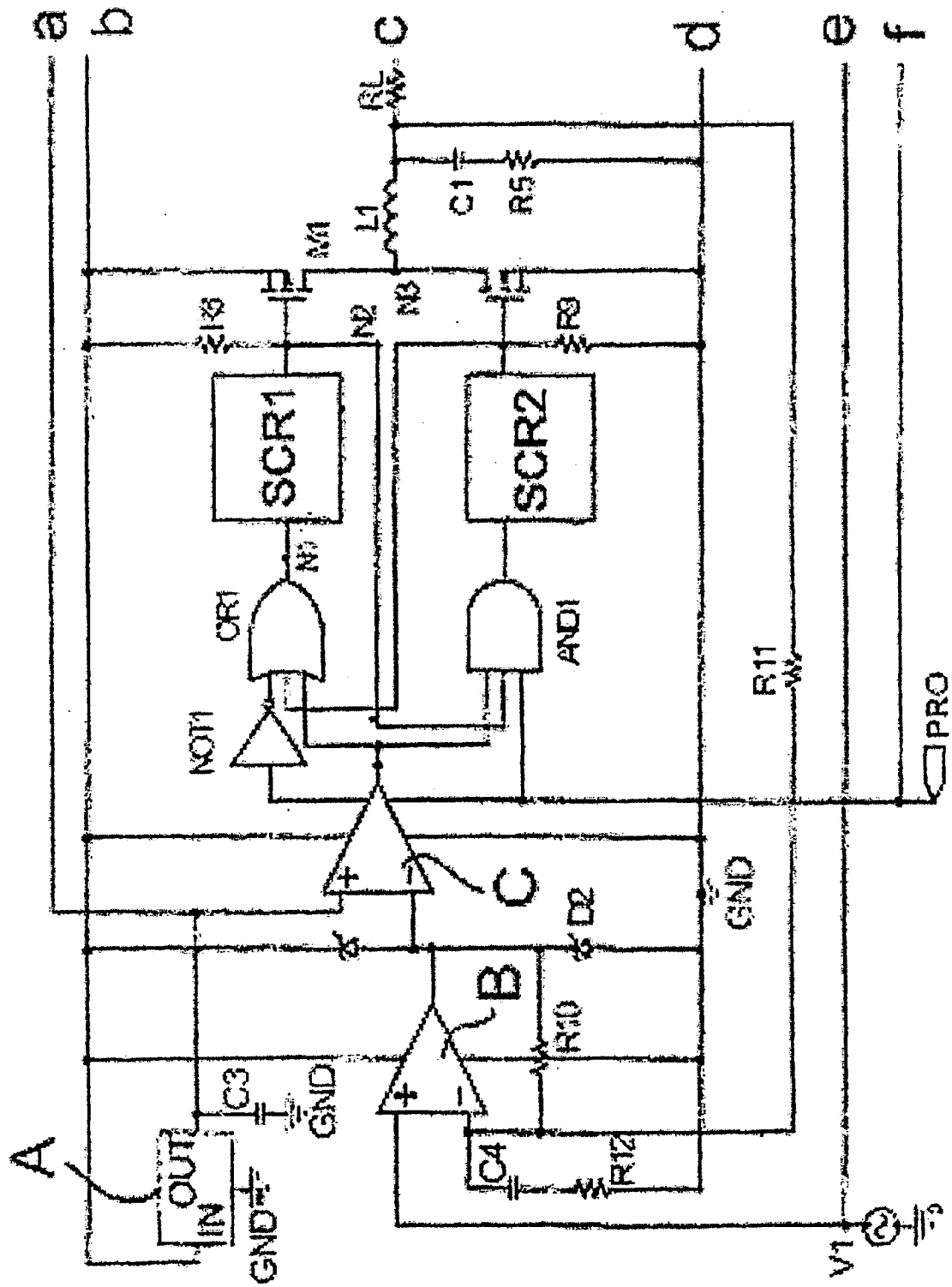
FIGS. 4a and 4b are circuit diagrams showing a first embodiment of a digital power amplifier in accordance with the present invention.
Figure 4B:
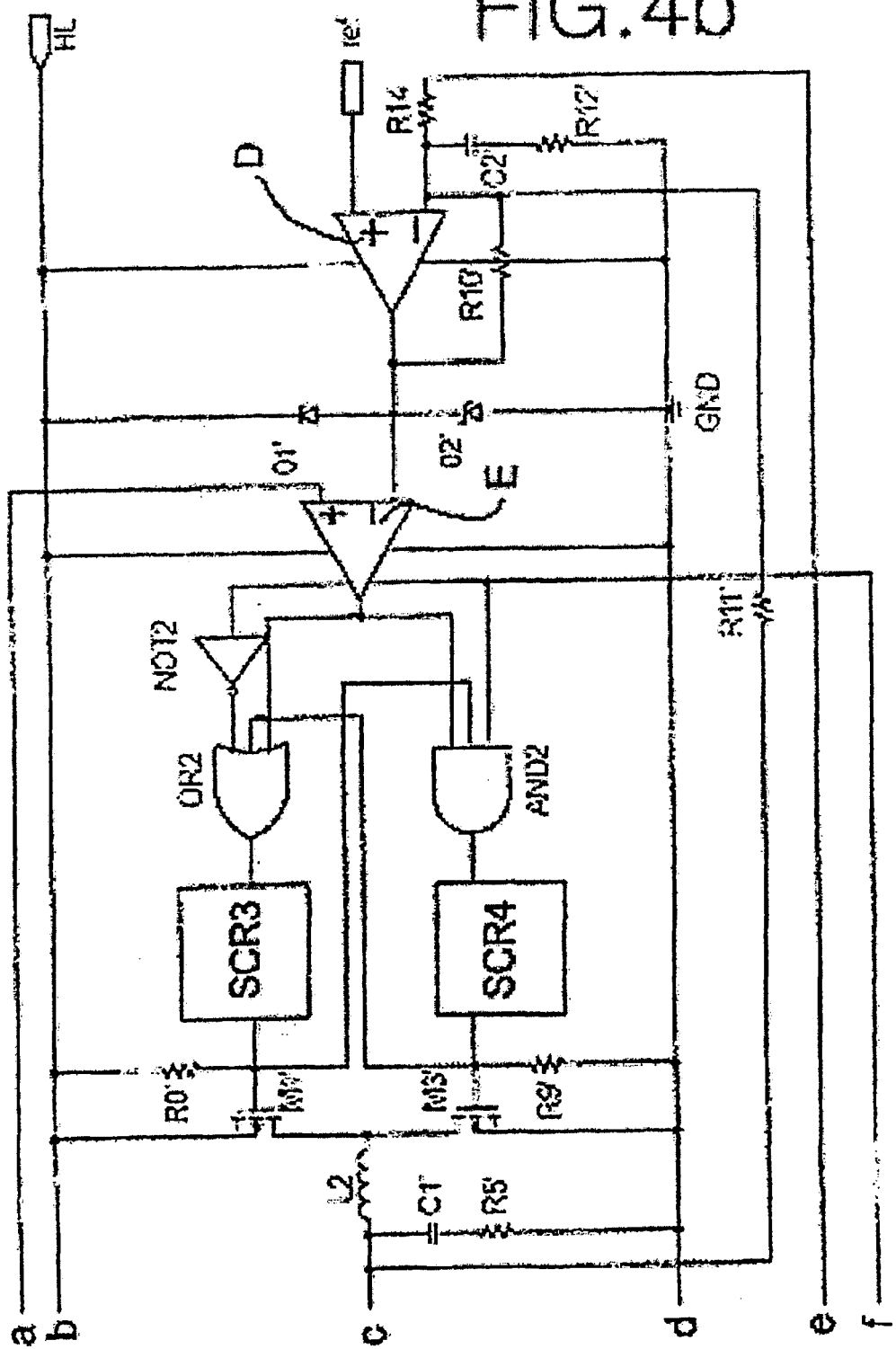
Figure 5:
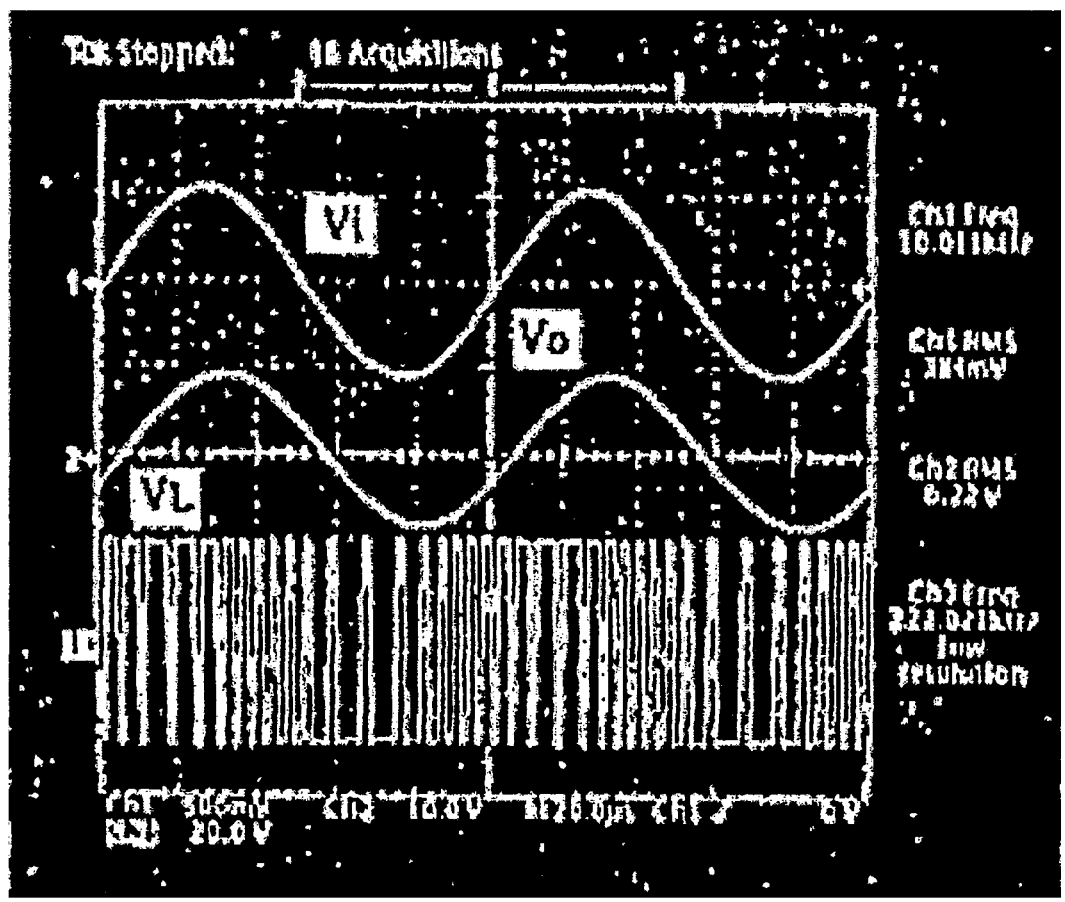
FIG. 5 is an input/output waveform-measuring diagram showing input signals, output signals, and a square wave outputted from a switching block of a digital power amplifier in accordance with the present invention.

When an overcurrent flows into both ends of load, the protection circuit (80) intercepts inputted signals to protect a circuit and is connected to the logic gates of the controller (40). If an overvoltage is detected by an overcurrent prevention resistor installed between sources of each Power MOS transistor and a bias voltage, the protection circuit (80) recognizes that an overcurrent flows into the load and inputs a signal of the protection circuit (80) to the controller (40), to make the controller (40) intercept the overcurrent. It is because a resistance value of a voltage detected from load resistance is bigger than the overcurrent prevention resistor. Therefore, in a short state, unlimited currents flow into the load, causing an almost '0' voltage even though the resistance value of the load voltage is bigger than the overcurrent prevention resistor, and most voltages are intercepted by the overcurrent prevention resistor. Therefore, if a voltage measured in the overcurrent prevention resistor is over a limitation, the overcurrent prevention resistor considers the voltage as an overcurrent. Besides, by directly measuring currents flowing into the load, it prevents unlimited currents from flowing into the both ends of the load by using the protection circuit. Generally, the logic gates of the controller (40) output signals capable of operating independently of signals of the protection circuit, and if a failure is generated, the logic gates output no signals by the signals of the protection circuit. FIGS. 4a and 4b are circuit diagrams showing a first embodiment of a digital power amplifier in accordance with the present invention. Referring to FIGS. 4a and 4b, a first amplifier block (4a) comprises as follows. An inverting amplifier (D) has a "+V" in one side of a bias voltage, and grounds the other side, then inputs an input analog signal to a "+terminal", and a sub-feedback signal is inputted to a "−terminal". A triangular wave oscillator (A) generates a regular triangular wave. A comparator (C) compares an input signal amplified to a regular size with a triangular wave to convert to a square wave having a regular width. SCR circuits (SCR1, SCR2) are composed of an OR gate (OR1) and an AND gate (AND1) to delay the square wave outputted from the comparator, and connect a NOT gate (NOT1) with the OR gate, and make sure of output signals of the gates (OR1, AND1) in output terminals of the OR gate (OR1) and the AND gate (AND1). Power MOS transistors (M1, M3, M1', M3') perform switching operations by the use of output signals of the gates. Low band pass filters (L1, C1) convert switching signals of the Power MOS transistors (M1, M3, M1', M3') into analog signals to output the analog signals to the load. A second amplifier block (4b) comprises the same configuration as the first amplifier block, however the second amplifier block inputs a signal outputted from the triangular oscillator (A) of the first amplifier block to a comparator (E) without installing another triangular oscillator inputted to a noninverting amplifier (D) and the comparator (E) instead of an inverting amplifier (B). The first amplifier block and the second amplifier block are comprised symmetrical to each other based on the load. By controlling input resistors (R12, R12', R14) of the inverting/ noninverting amplifiers (B, E) and sub-feedback resistors (R10, R10'), amplification gains can be equal. Because one terminal of a bias voltage is grounded, a DC voltage that is half of the bias voltage is applied to a "+terminal" of the inverting amplifier (E), showing operation characteristics of the amplifier. The reason why the first amplifier block and the second amplifier block are symmetrical to each other based on the load is as follows. If the two amplifiers are not symmetrical by the DC voltage applied to the "+terminal" of the inverting amplifier, current can be applied to the load. Therefore, by configuring the two amplifiers as symmetrical types, a potential difference of both ends of the load is removed without flowing any current. Also, because a circuit is symmetrically structured, the Power MOS transistors (M1, M3') and the Power MOS transistors (M3, M1') of the circuit are simultaneously driven as 'X' types based on the load. FIG. 5 is a diagram measuring an input signal (Vi), a square wave (VL) generated from output transistors, and an output signal (Vo) generated when the square wave passes through a low band pass filter of a digital power amplifier in accordance with the present invention. The output signal (Vo) is amplified in the same method as a waveform of the input signal (Vi).

INDUSTRIAL APPLICABILITY

A digital power amplifier in accordance with the present invention prevents burden of Power MOS transistors by applying digital signals to the Power MOS transistors, thereby preventing efficiency deterioration of the Power MOS transistors. Also, the digital power amplifier prevents output signals from being lost due to heat, reducing the size of a heatproof plate without installing a cooling fan. Therefore, the size of the amplifier is decreased as reducing a noise. A high sound quality can be obtained with small power consumption owing to higher efficiency.

What is claimed is:

1. A digital power amplifier comprising a first amplifier block and a second amplifier block, the first amplifier block comprising:

a noninverting amplifier performing a noninverting amplification for an inputted analog signal;

a triangular wave oscillator generating a triangular wave having a regular frequency;

a first comparator comparing an output signal of the amplifier with an output signal of the triangular wave oscillator, and outputting a square wave;

a first switching block composed of a first switch and a second switch switching an output signal of the comparator in turns;

a first controller preventing the first switch and the second switch of the first switching block from being in the same state at the same time;

a first filter converting an output signal of the first switching block controlled by the first controller into an analog signal; and a first sub-feedback circuit performing a sub-feedback operation for an output signal of the first filter, and inputting the sub-fed signal to the noninverting amplifier; and the second amplifier block comprising:

an inverting amplifier inputting an inverted analog signal, inputting a regular voltage, and amplifying the analog signal;

a second comparator comparing an output signal of the inverting amplifier with an output signal of the triangular wave oscillator of the first amplifier block, and outputting a square wave;

a second switching block composed of a third switch and a fourth switch switching an output signal of the second comparator in turns;

a second controller preventing the first switch and the second switch of the switching block from being in the same state at the same time;

a second filter converting an output signal of the second switching block controlled by the second controller into an analog signal; and a second sub-feedback circuit performing a sub-feedback operation for an output signal of the second filter, and inputting the sub-fed signal to the amplifier;

wherein, the first amplifier block and the second amplifier block are symmetrical to each other based on load.

2. The digital power amplifier of claim 1 wherein SCR circuits are connected between the controller and the switching block.

3. The digital power amplifier of claim 1, further comprising a protection circuit measuring an overcurrent flowing into load and protecting a circuit by intercepting the controller.

4. The digital power amplifier of claim 2, further comprising a protection circuit measuring an overcurrent flowing into load and protecting a circuit by intercepting the controller.

5. The digital power amplifier of claim 1, wherein a protection circuit connecting a resistor between the switching block and a bias voltage terminal of a circuit, to measure a voltage of the resistor, and intercepting the controller to protect a circuit if a voltage value is over a critical value, is further comprised.

6. A digital power amplifier comprising a first amplifier block and a second amplifier block, the first amplifier block comprising:
- a noninverting amplifier performing a noninverting amplification for an inputted analog signal;
- a triangular wave oscillator generating a triangular wave having a regular frequency;
- a first comparator comparing an output signal of the amplifier with an output signal of the triangular wave oscillator, and outputting a square wave;
- a first switching block composed of a first switch and a second switch switching an output signal of the comparator in turns;
- a first controller preventing the first switch and the second switch of the first switching block from being in the same state at the same time;
- a first filter converting an output signal of the first switching block controlled by the first controller into an analog signal; and
- a first sub-feedback circuit performing a sub-feedback operation for an output signal of the first filter, and inputting the sub-fed signal to the noninverting amplifier; and the second amplifier block comprising:
- an inverting amplifier inputting an inverted analog signal, inputting a regular voltage, and amplifying the analog signal;
- a second comparator comparing an output signal of the inverting amplifier with an output signal of the triangular wave oscillator of the first amplifier block, and outputting a square wave;
- a second switching block composed of a third switch and a fourth switch switching an output signal of the second comparator in turns;
- a second controller preventing the first switch and the second switch of the switching block from being in the same state at the same time;
- a second filter converting an output signal of the second switching block controlled by the second controller into an analog signal; and
- a second sub-feedback circuit performing a sub-feedback operation for an output signal of the second filter, and inputting the sub-fed signal to the amplifier;

wherein, the first amplifier block and the second amplifier block are symmetrical to each other based on load, SCR circuits are connected between the controller and the switching block and a protection circuit connecting a resistor between the switching block and a bias voltage terminal of a circuit, to measure a voltage of the resistor, and intercepting the controller to protect a circuit if a voltage value is over a critical value, is further comprised.

* * * * *